(12) United States Patent
Hart et al.

(10) Patent No.: US 9,058,853 B2
(45) Date of Patent: Jun. 16, 2015

(54) INTEGRATED CIRCUIT HAVING IMPROVED RADIATION IMMUNITY

(75) Inventors: Michael J. Hart, Palo Alto, CA (US); James Karp, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 79 days.

(21) Appl. No.: 13/587,823

(22) Filed: Aug. 16, 2012

(65) Prior Publication Data

US 2014/0048887 A1 Feb. 20, 2014

(51) Int. Cl.

| H01L 27/11 | (2006.01) |
|---|---|
| G11C 5/00 | (2006.01) |
| G11C 11/412 | (2006.01) |
| H01L 21/8238 | (2006.01) |
| H01L 27/02 | (2006.01) |
| H03K 19/003 | (2006.01) |
| H01L 27/092 | (2006.01) |

(52) U.S. Cl.
CPC ............ *G11C 5/005* (2013.01); *G11C 11/4125* (2013.01); *H01L 21/823892* (2013.01); *H01L 27/0207* (2013.01); *H01L 27/1104* (2013.01); *H03K 19/00338* (2013.01); *H01L 27/0921* (2013.01)

(58) Field of Classification Search
USPC ............ 257/369, 372, 393; 438/199; 365/156
See application file for complete search history.

(56) References Cited

U.S. PATENT DOCUMENTS

| 5,404,041 A | 4/1995 | Diaz et al. | |
|---|---|---|---|
| 5,506,437 A | 4/1996 | May et al. | |
| 5,714,784 A | 2/1998 | Ker et al. | |
| 6,005,797 A * | 12/1999 | Porter et al. | ................ 365/156 |
| 6,446,250 B1 | 9/2002 | Becker | |
| 6,550,047 B1 | 4/2003 | Becker | |
| 6,614,078 B2 * | 9/2003 | Lee et al. | ...................... 257/372 |
| 6,730,947 B2 * | 5/2004 | Kuwazawa | ................... 257/213 |
| 6,956,266 B1 | 10/2005 | Voldman et al. | |
| 7,549,135 B2 | 6/2009 | Chapman et al. | |
| 7,626,243 B2 | 12/2009 | Disney et al. | |
| 7,973,371 B2 * | 7/2011 | Furuta et al. | .................. 257/393 |
| 8,004,904 B2 * | 8/2011 | Momii | ..................... 365/185.25 |
| 2002/0031882 A1 * | 3/2002 | Uchida | ......................... 438/228 |
| 2003/0174452 A1 * | 9/2003 | Chen et al. | ...................... 361/56 |
| 2004/0047094 A1 | 3/2004 | Chen et al. | |
| 2005/0275032 A1 | 12/2005 | Kodama et al. | |
| 2006/0142899 A1 * | 6/2006 | Wobben | ....................... 700/286 |
| 2006/0226499 A1 | 10/2006 | Shimizu | |
| 2007/0004150 A1 | 1/2007 | Huang et al. | |

(Continued)

OTHER PUBLICATIONS

Dodds, N. A. et al., "Selection of well Contact Densities for Latchup-Immune Minimal-Area ICs", IEEE Transactions on Nuclear Science, IEEE Service Center, New York, NY, US, vol. 57 No. 6, Dec. 2010, pp. 3575-3581.

(Continued)

*Primary Examiner* — Cheung Lee
*Assistant Examiner* — Stephen Bradley
(74) *Attorney, Agent, or Firm* — John J. King

(57) ABSTRACT

An integrated circuit having improved radiation immunity is described. The integrated circuit comprises a substrate; an n-well formed on the substrate; a p-well formed on the substrate; and a p-tap formed in the p-well adjacent to the n-well, wherein the p-tap extends between circuit elements formed in the n-well and circuit elements formed in the p-well, and is coupled to a ground potential. A method of forming an integrated circuit having improved radiation immunity is also described.

12 Claims, 9 Drawing Sheets

(56) References Cited

U.S. PATENT DOCUMENTS

| | | | |
|---|---|---|---|
| 2007/0080406 | A1 | 4/2007 | Snyder et al. |
| 2008/0029820 | A1 | 2/2008 | Disney et al. |
| 2008/0134104 | A1 | 6/2008 | Chapman et al. |
| 2008/0142899 | A1* | 6/2008 | Morris et al. ............ 257/371 |
| 2009/0180225 | A1 | 7/2009 | Pan et al. |
| 2010/0264953 | A1* | 10/2010 | Lilja ............................. 326/12 |
| 2011/0049621 | A1 | 3/2011 | Lotfi et al. |
| 2014/0145293 | A1 | 5/2014 | Jain et al. |

OTHER PUBLICATIONS

Hsieh, C.M., et al., *A field funneling effect on the collection of alpha-particle-generated carriers in silicon devices*, IEEE Electron Device Letters, vol. 2, EDL. 2, No. 4, pp. 103-105, Apr. 1981.

Ziegler, J.F. et al., *SER-History, Trends and Challengers, a guide for designing with Memory ICs*, Cypress Semiconductor, pp. 6-3-6-5, Chapter 6, 2004, US.

U.S. Appl. No. 13/439,721, filed Apr. 4, 2012 Karp, James, et al.; Xilinx, Inc., 2100 Logic Drive, San Jose, CA USA.

U.S. Appl. No. 13/439,706, filed Apr. 4, 2012 Hart, Michael J., et al.; Xilinx, Inc., 2100 Logic Drive, San Jose, CA USA.

U.S. Appl. No. 12/793,584, filed Jun. 3, 2010, Karp et al.

U.S. Appl. No. 14/010,059, filed Aug. 26, 2013, Fakhruddin et al.

Allen, Phillip E., *Lecture 80—Latchup & ESD*, Mar. 24, 2010, pp. 080-1 to 080-32, AICDesign.org.

Wang, Albert Z.H., *On-Chip ESD Protection for Integrated Circuits: An IC Design Perspective*, Jan. 2002, pp. 74-75, Kluwer Academic Publishers, Boston, Massachusetts, USA.

Jan, C.H., et al., "A 32nm SoC Platform Technology with $2^{nd}$ Generation High-k/Metal Gate Transistors Optimized for Ultra Low Power, High Performance, and High Density Product Applications", pp. 28.1.1-28.1.4, 2009 IEEE International Electron Devices Meeting, IEDM09, Dec. 6-9, 2009, Baltimore, MD.

Klein, M., "Power Consumption at 40 and 45nm", White Paper, WP298 (v1.0), Apr. 13, 2009, pp. 1-21, p. 7, Xilinx, Inc., San Jose, CA.

Santarini, M., "How Xilinx Halved Power Draw in 7 Series FPGAs", Xilinx, Inc., Xcell Journal, Issue 76, $3^{rd}$ Quarter, 2011, pp. 10-11, San Jose, CA.

Shiyanovskii, Y. et al., "Effect of Voltage Scaling on soft Error Protection Methods for SRAMs", Proceedings of the IEEE 2010 National Aerospace and Electronics Conference (NAECON), Jul. 14-16, 2010, pp. 328-333 Dayton, Ohio.

* cited by examiner

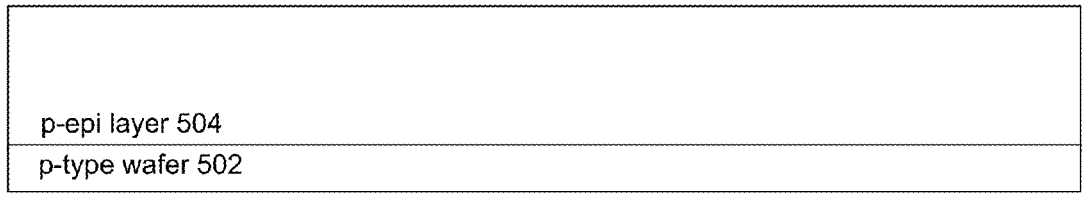
FIG. 8-A
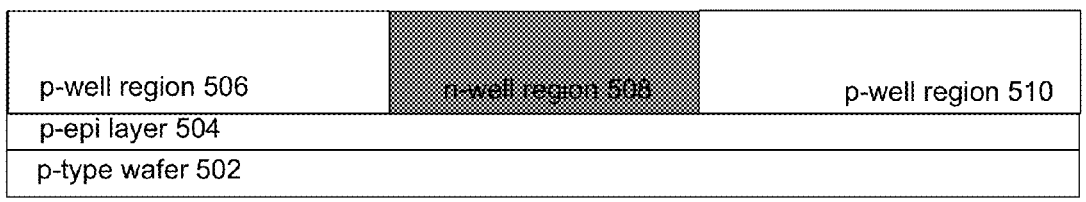
FIG. 8-B
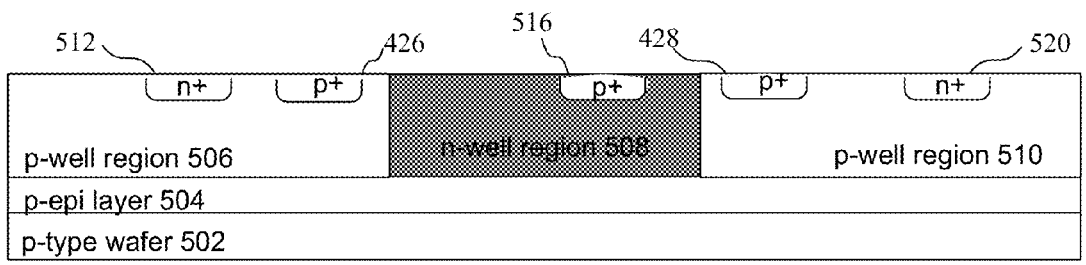
FIG. 8-C
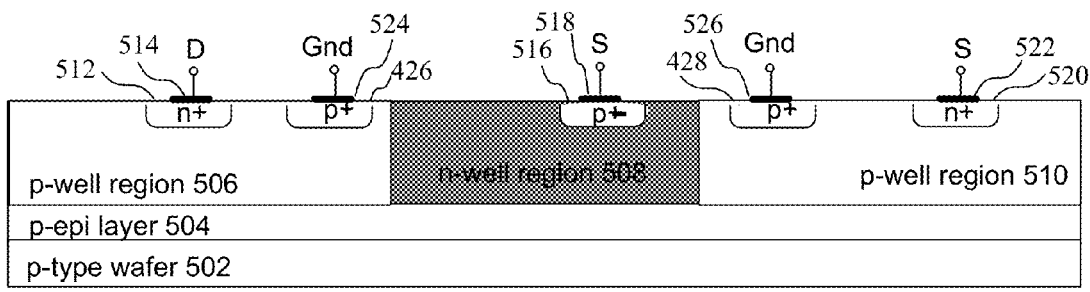
FIG. 8-D

US 9,058,853 B2

INTEGRATED CIRCUIT HAVING IMPROVED RADIATION IMMUNITY

FIELD OF THE INVENTION

An embodiment relates generally to integrated circuits, and in particular, to an integrated circuit having improved radiation immunity and to a method of implementing an integrated circuit.

BACKGROUND OF THE INVENTION

Integrated circuits are an important element of electronic devices. However, the operation of an integrated circuit may be affected by a radiation impact. As the dimensions of circuit elements of integrated circuits decrease, data stored in an integrated circuit may be more likely to be corrupted by radiation impacts, often called single event upset (SEU) strikes. Such radiation impacts may change or "upset" data stored in a memory element. The corrupted data may impact the performance of the integrated circuit. In some instances, the corrupted data may render the integrated circuit unusable until the correct data is restored in the memory. While techniques exist to both detect and correct data errors without having to reload the entire memory, such techniques have significant limitations.

Radiation impacts generate minority carriers which may upset the charge concentration in certain regions of the integrated circuit. Conventional techniques to sink minority carries generated during an SEU strike rely on a "buried layer" having a high recombination rate. However, experiments have shown that this layer leads to the opposite result. That is, the SEU rate increases as highly doped buried P+ layer repels minority carriers or charge, such as electrons in p-substrate. Accordingly, conventional methods of addressing the impact of an SEU strike have failed to prevent the undesirable loss of data.

SUMMARY OF THE INVENTION

An integrated circuit having improved radiation immunity is described. The integrated circuit comprises a substrate; an n-well formed on the substrate; a p-well formed on the substrate; and a p-tap formed in the p-well adjacent to the n-well, wherein the p-tap extends between circuit elements formed in the n-well and circuit elements formed in the p-well, and is coupled to a ground potential.

According to an alternate embodiment, an integrated circuit having improved radiation immunity comprises a matrix of memory cells, each memory cell having a portion of a p-well and a corresponding portion of an n-well; and a plurality of p-taps, each p-tap extending along a column of memory elements of the plurality of memory cells; wherein, for each memory cell of the plurality of memory cells, the n-channel transistors in a portion of the p-well are on the opposite side of a p-tap from the corresponding p-channel transistors in a portion of the n-well.

A method of forming integrated circuit having improved radiation immunity is also disclosed. The method may comprise forming an n-well on substrate; forming a p-well on the substrate; and forming a p-tap in the p-well adjacent to the n-well, wherein the p-tap extends between circuit elements formed in the n-well and circuit elements formed in the p-well and is coupled to a ground potential.

BRIEF DESCRIPTION OF THE DRAWINGS

FIG. 8 is a series of cross-sectional views showing the formation of the integrated circuit of FIG. 7 according to an embodiment;

DETAILED DESCRIPTION OF THE DRAWINGS

Figure 1:
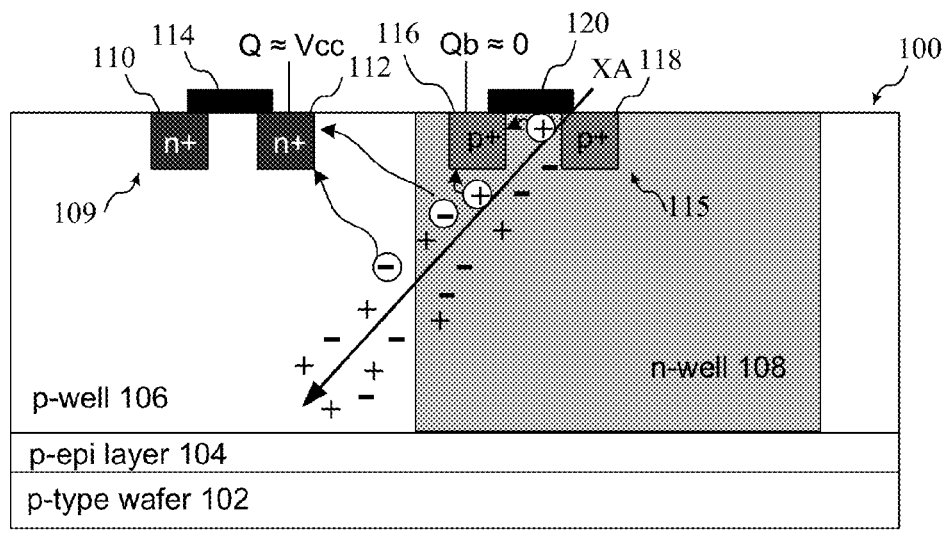
FIG. 1 is a cross-sectional view of an integrated circuit according to an embodiment.

Turning first to FIG. 1, a cross-sectional view of an integrated circuit according to an embodiment is shown. The integrated circuit of FIG. 1 comprises a p-type wafer 102 and a p-epitaxial (p-epi) layer 104. A p-well 106 and an n-well 108 are formed in the p-epitaxial layer 104. Transistor elements are formed in the p-well 106 and the n-well 108. In particular, a first transistor in the p-well 106 comprises a source region 110, a drain region 112 and a gate 114, as shown. A second transistor in the n-well 108 comprises a source region 116, a drain region 118 and a gate 120. The transistors of FIG. 1 are shown by way of example, and may be used in a memory cell, for example. However, as will be described in more detail below, one or more p-taps implemented in an integrated circuit may be implemented near an n-well to prevent undesirable minority charge from changing storage states of memory elements.

Radiation impacts on a semiconductor device may result in undesirable minority charge in regions that have a certain charge (i.e. majority charge for that region. Such radiation impacts may affect storage elements of a memory device. An undesirable change in data of a memory device is commonly called a single event upset (SEU). An SEU in a complementary metal oxide semiconductor (CMOS) static random access memory (SRAM) may be caused by two effects: the discharge of a high potential at an "n+" drain of an NMOS device (which is off) to a low potential, and charging up from a zero potential at a "p+" drain of a PMOS (which is off) to a higher potential. A rate of SEUs of an SRAM memory in proximity to an n-well is due to photovoltaic separation of charges that takes place at n-well boundaries. This separation of charges leads to increase of potential in the p-well and decrease of potential of the n-well. This forward biases all p-n junctions both in the n-well and p-well. As a result, nodes having a potential close to ground (i.e. logical "0" nodes) charge up and nodes having a high potential (i.e. logical "1" nodes) discharge their potential. The simultaneous changes at storage junctions of SRAM may act concurrently to flip the memory state. In the case of a near or direct particle strike of a memory cell, the discharging/charging of one storage node is sufficient to cause a SEU.

Figure 2:
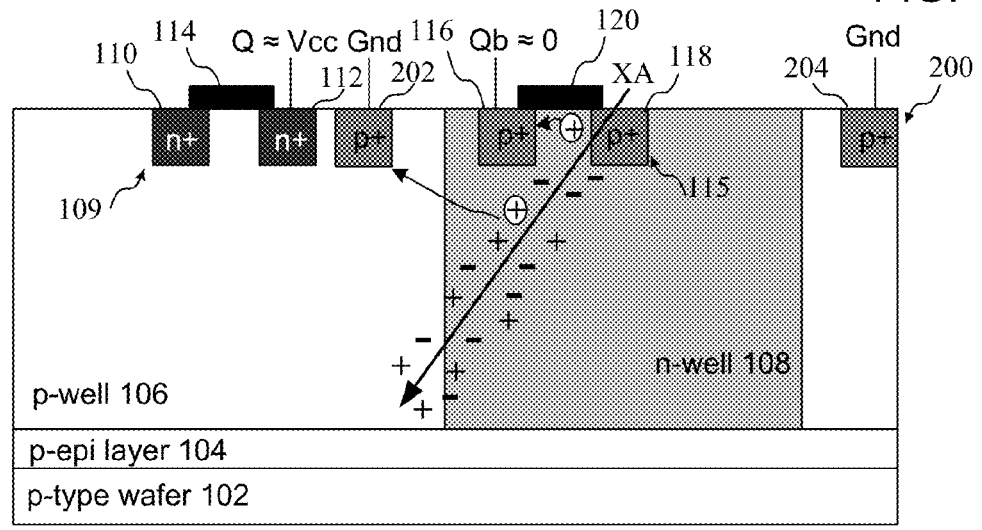
FIG. 2 is a cross-sectional view of an integrated circuit having a p-tap according to an embodiment.

As shown in the cross-sectional view of the integrated circuit embodiment of FIG. 2, p-taps 202 and 204 are placed on either side of the n-well. The p-taps are formed using the same process as the p-wells for the transistors. However, it should be understood that the p-taps could be deeper than the p-wells for the transistors. The placement of p-taps near an n-well helps prevent minority carriers from affecting nodes which are storing charge. More particularly, the placement of p-taps on both sides of n-well in a memory, for example, significantly suppresses photovoltaic substrate bias and reduces SEUs compared to conventional memory devices. Due to photovoltaic effect, the rate of SEUs strongly depends on whether an ionization track crosses the n-well boundary or not. The use of p-taps significantly reduces the effect of minority carriers generated as a result of a radiation strike. As shown in FIG. 2, the minority carriers (i.e. positive charges in the n-well) are attracted to the p-taps 202 and 204 as shown.

Figure 3:
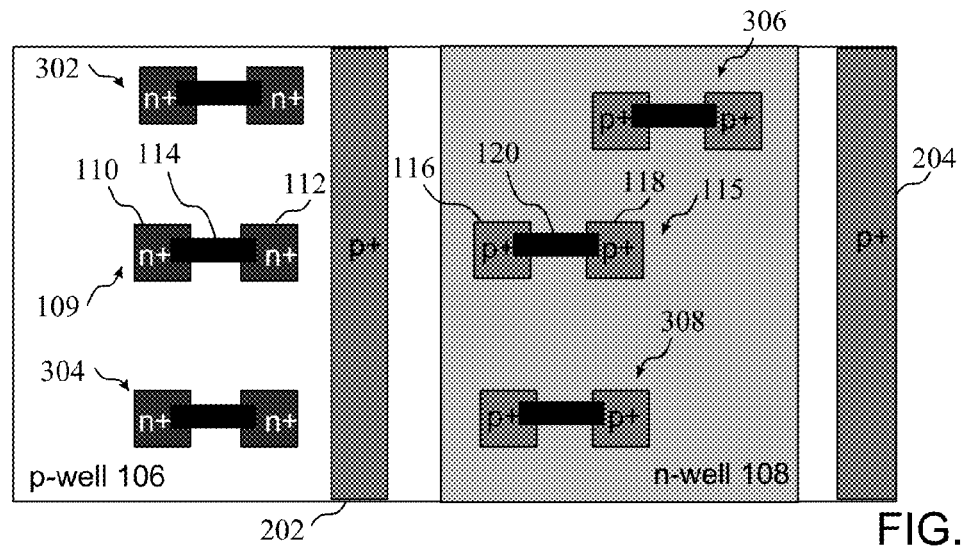
FIG. 3 is a top plan view of the integrated circuit of FIG. 2 showing the p-tap and circuit elements formed in a p-well and an n-well.

As can be seen in the FIG. 3, which is a top plan view of the integrated circuit of FIG. 2, the p-taps 202 and 204 extend along the n-well 108, where p-tap 202 attracts positive charge which might otherwise affect the charge of a node of a circuit in the n-well 108. In addition to transistors 109 and 115, n-channel transistors 302 and 304 in the p-well 106 and p-channel transistors 306 and 308 in the n-well 108 may be implemented as a part of a circuit. As will be described in more detail below in reference to FIGS. 5 and 6, the transistors 304-308 may be associated with a single circuit, such as an SRAM cell.

Figure 4:
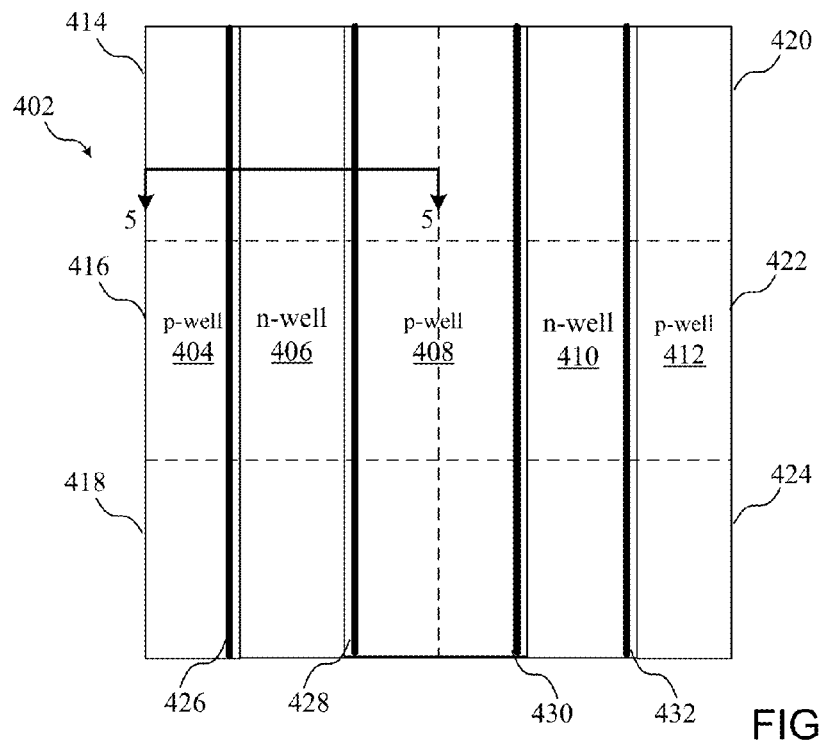
FIG. 4 is a top plan view of the integrated circuit showing p-taps in a memory array according to an embodiment.

Turning now to FIG. 4, a top plan view of the integrated circuit shows p-taps in a memory array according to an embodiment. The p-taps are formed in strips extending the length of the n-well, where each p-tap is associated with a plurality of memory cells. In particular, a portion 402 of a memory array comprises p-wells separated by n-wells, including p-wells 404, 408, and 412 separated by n-wells 406 and 410 as shown. The portion 402 of memory array comprises 6 memory cells 414-424 designated by the dashed lines. As will be described in more detail in the embodiment of FIG. 5, transistors formed in both the p-wells 404 and 408 are associated with transistors formed in the n-well 406 to form a memory element or other circuit, such as the memory elements of FIGS. 9-11 or the flip-flop of FIG. 12. As shown in FIG. 4, p-taps 426 and 428 extend along the memory cells 414-418, while p-taps 430 and 432 extend along memory cells 420-424. As further shown in FIG. 4, the p-wells 404 and 412 are generally narrower that the p-well 408 because p-well 408 is used for memory cells on both sides of the p-well. However, it should be understood that for a wider memory array having many more memory cells, the p-wells 404 and 412 would have the same width as p-well 408.

Figure 5:
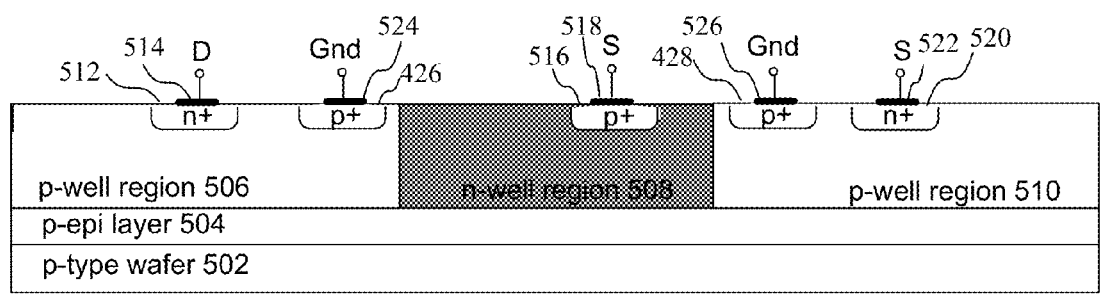
FIG. 5 is a cross-sectional view of a memory cell of the memory array of FIG. 4 according to an embodiment.

Turning now to FIG. 5, a cross-sectional view of a memory cell of the memory array of FIG. 4 according to an embodiment is shown. The memory cell of FIG. 5 is formed on a p-type wafer 502 and a p-epi layer 504, where the p-well regions 404 and 408 and the n-well 406 are formed in the p-epi layer 504. Also shown in FIG. 5, source and drain regions, as well as contacts coupled to the source and drain regions, are provided. In particular, a drain region 512 formed in the p-well region 506 of the p-well 404 and a corresponding contact 514 is shown. A source region 516 formed in the n-well region 508 of the n-well 406 and a corresponding contact 518 is also shown. A source region 520 formed in a p-well region 510 of the p-well 408 and a corresponding contact 522 is shown.

Figure 6:
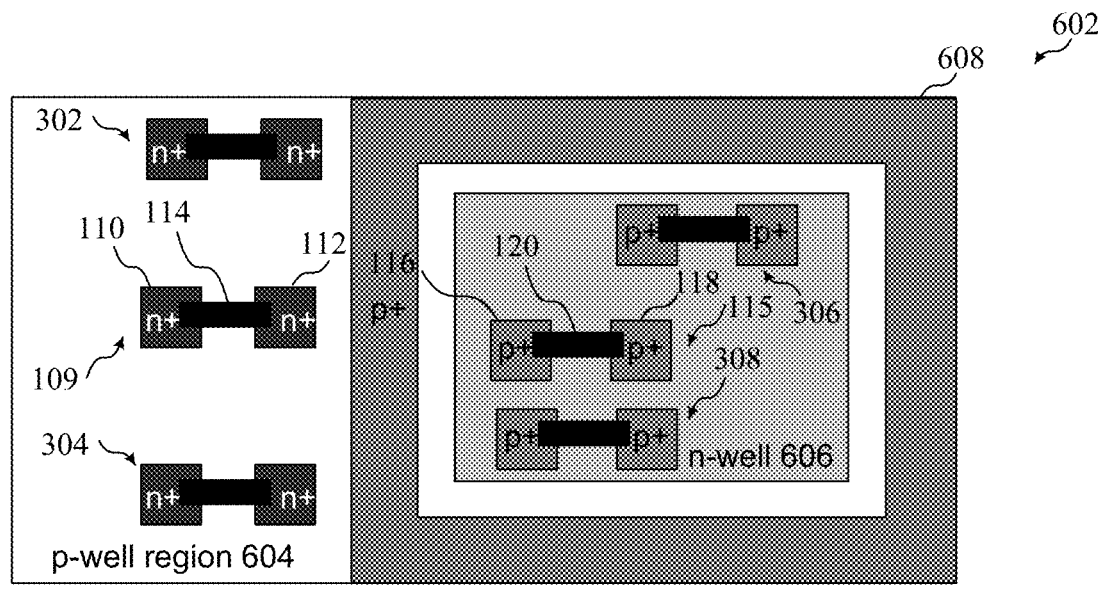
FIG. 6 is a top plan view of the integrated circuit of FIG. 2 showing a p-tap and circuit elements formed in a p-well and an n-well according to an alternate embodiment.

As shown in FIG. 6, a top plan view of the memory cell 602 according to an alternate embodiment is shown. According to the embodiment of FIG. 6, the memory cell 602 comprises various transistors, shown here as transistors 109, 302 and 304, formed in a p-well region 604. Other transistors, shown here as transistors 115, 306 and 308, are formed in the n-well 606. According to the embodiment of FIG. 6, a p-tap 608 is formed in the p-region 604 and surrounds the n-well 606. The p-tap 608 according to the embodiment of FIG. 6 would place portions of the p-tap in close proximity to the more regions of the n-well, improving the chances that minority charges in the n-well are attracted to the grounded p-tap 608. While the memory cell of FIG. 6 shows a single p-well region 604 adjacent to the n-well 606 and the p-tap 608, it should be understood, that the n-well 606 and the p-tap 608 could be placed between p-well regions, as will be described in reference to FIG. 7

Figure 7:
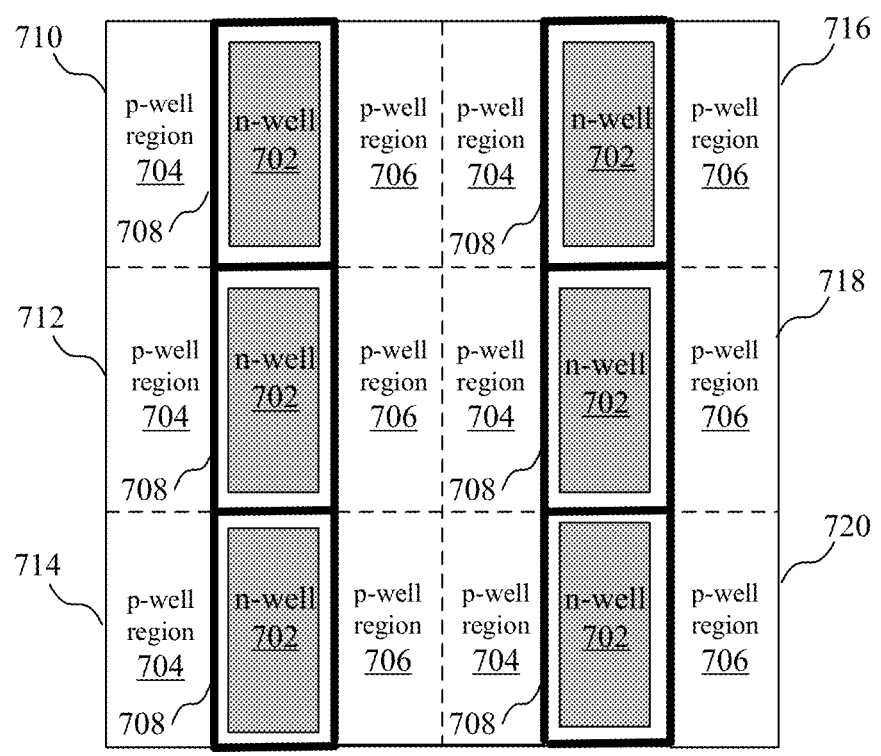
FIG. 7 is a top plan view of the integrated circuit showing p-taps in a memory array according to an alternate embodiment.

As shown in FIG. 7, a memory cell, such as the memory cell 602, may be implemented in a memory array. According to the embodiment of FIG. 7, an n-well 702 is located between p-well regions 704 and 706 and a p-tap 708 coupled to ground surrounds the n-well 702. While the embodiment of FIG. 7 shows six memory cells, 710-720, it should be understood that many additional cells could be provided on all four sides of the memory array as shown. While n-well 702 and the p-tap 708 is formed in the center of the cell, it should be understood that the n-well 702 and the p-tap 708 for a given memory cell could be placed in a different location, such as on a side as shown in FIG. 6, relative to the p-well region having transistors associated with that memory cell.

Turning now to FIG. 8, a series of cross-sectional views shows the formation of the integrated circuit of FIG. 8 according to an embodiment. The p-epi layer 504 is formed on the p-type wafer 502, as shown in FIG. 8-A. The n-well region 508 and the p-well regions 506 and 510 are then formed as shown in FIG. 8-B. The source and drain elements and the p-taps are then formed, as shown in FIG. 8-C. The contact elements for the source and drain elements are then formed, as shown in FIG. 8-D.

Figure 9:
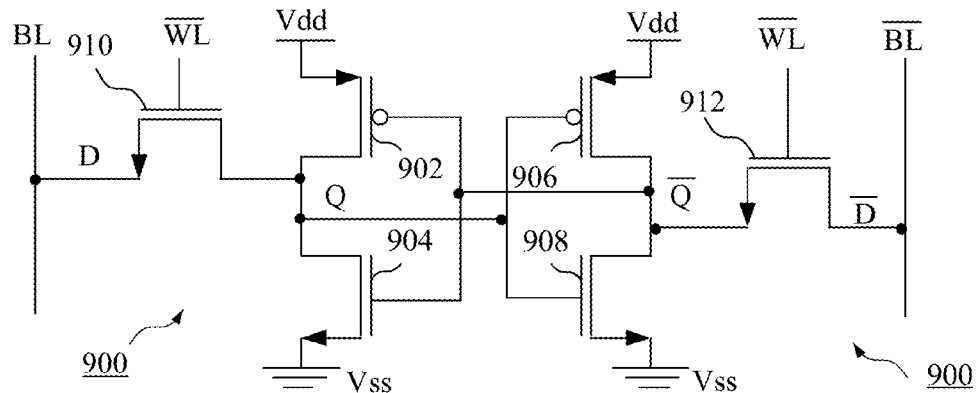
FIG. 9 is a block diagram of a memory element according to an embodiment.

Turning now to FIG. 9, a block diagram of a memory element 900 according to an embodiment is shown. The memory cell includes an inverter having a p-channel transistor 902 with a source coupled to a reference voltage, such as Vdd, and a drain coupled at a first node "Q" to a drain of an n-channel transistor 904, the source of which is coupled to a ground potential (Vss). The memory cell includes a second inverter having a p-channel transistor 906 with a source coupled to the reference voltage and a drain coupled at a second node "Q_bar" to a drain of an n-channel transistor 908, the source of which is also coupled to ground. The first node "Q" is controlled by an n-channel transistor 910 coupled to receive an inverted word line (WL_bar) signal at its gate which controls the receipt of input data on a bit line (BL) at the first node. The second node "Q-bar" is controlled by another n-channel transistor 912 coupled to receive the inverted word line signal at its gate which controls the receipt of inverted input data at the second node. While the memory cell of FIG. 9 is shown by way of example, other memory cells could be employed. Depending upon the dimensions of the transistors of a memory, and particularly the gate widths of the transistors of a memory, a particle associated with cosmic radiation may affect a number of transistors. By providing the p-taps as set forth above, a loss of data can be significantly reduced. In order to achieve the same immunity from radiation strikes using conventional circuit arrangements, a twelve terminal (12T) cell would be required. However, a 12T cell would have a significantly larger footprint. The footprint of the 6T cell as shown in FIG. 9 with the p-taps as described above would be considerably smaller than a 12T cell.

Figure 10:
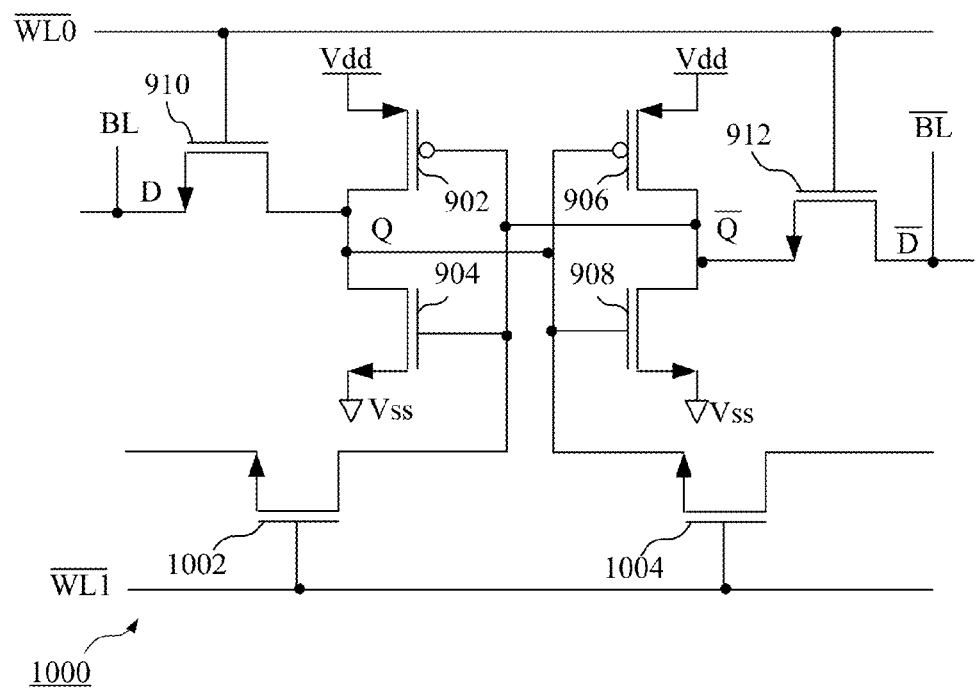
FIG. 10 is a block diagram of a memory element according to an alternate embodiment.

While the embodiment of FIG. 9 represents a "6T cell," the memory element 1000 of FIG. 10 represents an "8T cell." In particular, the transistors 1002 and 1004 are configured to enable separate inverted word lines WL0_bar and WL1_bar. The transistors 1002 and 1004 are configured as shown to have the source coupled to the Q and Q_bar nodes as shown, where the gates are each controlled by the inverted WL1_bar.

Figure 11:
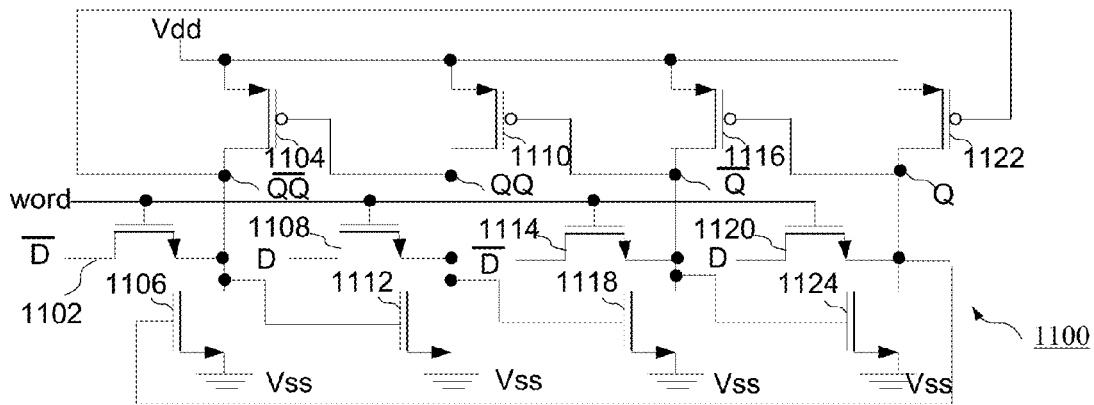
FIG. 11 is a block diagram of a memory element according to a further embodiment.

Turning now to FIG. 11, a block diagram of a memory element 1100 according to a further embodiment is shown. FIG. 11 shows a 12T cell comprising a plurality of CMOS transistor elements coupled between Vdd and ground. In particular, the inverted data D-bar node is coupled by a transistor 1102 to a QQ-bar node at the drains of the transistors 1104 and 1106. The data D node is coupled by a transistor 1108 to a QQ node at the drains of the transistors 1110 and 1112. The inverted data D-bar node is coupled by a transistor 1114 to a Q node at the drains of the transistors 1116 and 1120. The inverted data D-bar node is coupled by a transistor 1120 to a Q node at the drains of the transistors 1122 and 1124. The word signal is coupled to the gates of the transistors 1102, 1108, 1114, and 1120 to generate the appropriate output data at the Q node based upon the input data at the D node.

Figure 12:
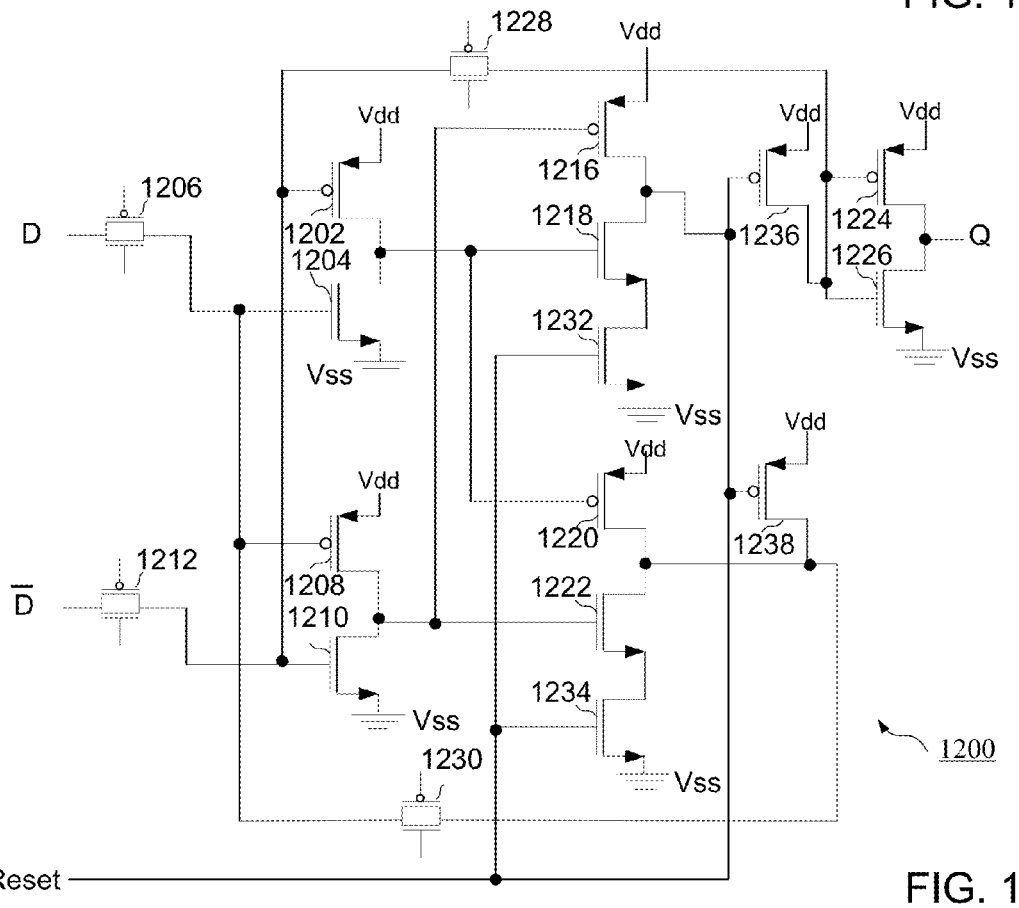
FIG. 12 is a block diagram of a flip-flop implemented according to an embodiment.

Turning now to FIG. 12, a block diagram of a flip-flop 1200 according to an embodiment is shown. A plurality of inverters is implemented in a cross-coupled arrangement to enable generating output data at the Q node based upon input data at the D node as shown in FIG. 12. In particular, a first CMOS transistor pair coupled in series between Vdd and ground comprises a p-channel transistor 1202 and an n-channel transistor 1204, where the data node D is coupled to the gate of the transistor 1204 by a CMOS pass gate 1206, as shown. A second CMOS transistor pair coupled in series between Vdd and ground comprises a p-channel transistor 1208 and an n-channel transistor 1210, where the inverted data node D-bar is coupled to the gate of the n-channel transistor 1210 by a CMOS pass gate 1212. A third CMOS transistor pair coupled in series between Vdd and ground comprises a p-channel transistor 1216 and an n-channel transistor 1218, where gate of the transistor 1218 is coupled to the drains of the transistors 1202 and 1204, and the gate of the transistor 1216 is coupled to the drains of the transistors 1208 and 1210. A fourth CMOS transistor pair coupled in series between Vdd and ground comprises a p-channel transistor 1220 and an n-channel transistor 1222, where gate of the transistor 1220 is coupled to the drains of the transistors 1202 and 1204 and the gate of the n-channel transistor 1222 is coupled to the drains of the transistors 1208 and 1210. An output inverter comprising a p-channel transistor 1224 and an n-channel transistor 1226 is coupled in series between Vdd and ground to generate the output data Q at the drains of the transistors 1224 and 1226, where the gates of the transistors 1224 and 1226 are coupled to the inverted data D-bar node by way on a CMOS transistor pair pass gate 1228. The drains of the transistors 1220 and 1222 are also coupled to the data node D by way of a CMOS pass gate 1230. Finally, a plurality of transistors enables a reset function. In particular, a transistor 1232 is coupled between the source of the p-channel transistor 1218 and ground, a transistor 1234 is coupled between the source of the transistor 1222 and ground, a transistors 1236 is coupled between Vdd and the gates of the transistors 1224 and 1226, and a transistor 1238 is coupled between Vdd and the drains of the transistors 1220 and 1222. The gates of each of the transistors 1232, 1234, 1236 and 1238 are coupled to receive the reset signal to reset the flip-flop. The flip-flop 1200 of FIG. 12 could also be implemented with a p-tap between transistors in the n-well and transistors in the p-well, as described above in reference to FIGS. 2-7.

Figure 13:
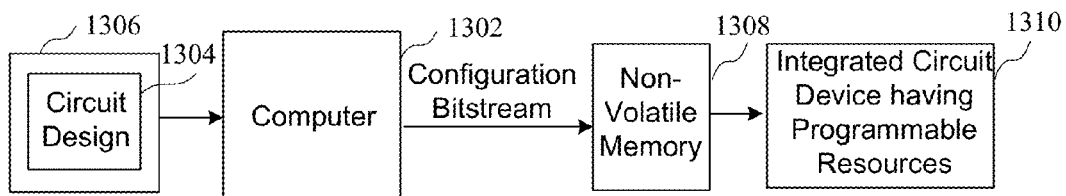
FIG. 13 is a block diagram of a system for programming a device having programmable resources according to an embodiment.

Turning now to FIG. 13, a block diagram of a system for programming a device having programmable resources according to an embodiment is shown. In particular, a computer 1302 is coupled to receive a circuit design 1304 from a memory 1306, and generate a configuration bitstream which is stored in the non-volatile memory 1306. As will be described in more detail below, the circuit design may be a high level design, such as a circuit design defined in a hardware description language (HDL). Also, the computer may be configured to run software that generates a configuration bitstream which is stored in the non-volatile memory 1308 and provided to an integrated circuit 1310 which may be a programmable integrated circuit, such as the integrated circuit described below in FIG. 14.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 902 may implement the portions of a circuit design implementing certain functions in configurable logic blocks (CLBs) or digital signal processing (DSP) blocks, for example. An example of a synthesis tool is the ISE tool available from Xilinx, Inc. of San Jose Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen, available from Xilinx, Inc. of San Jose, Calif. The bitstream is either downloaded by way of a cable or programmed into an EPROM for delivery to the programmable integrated circuit.

Figure 14:
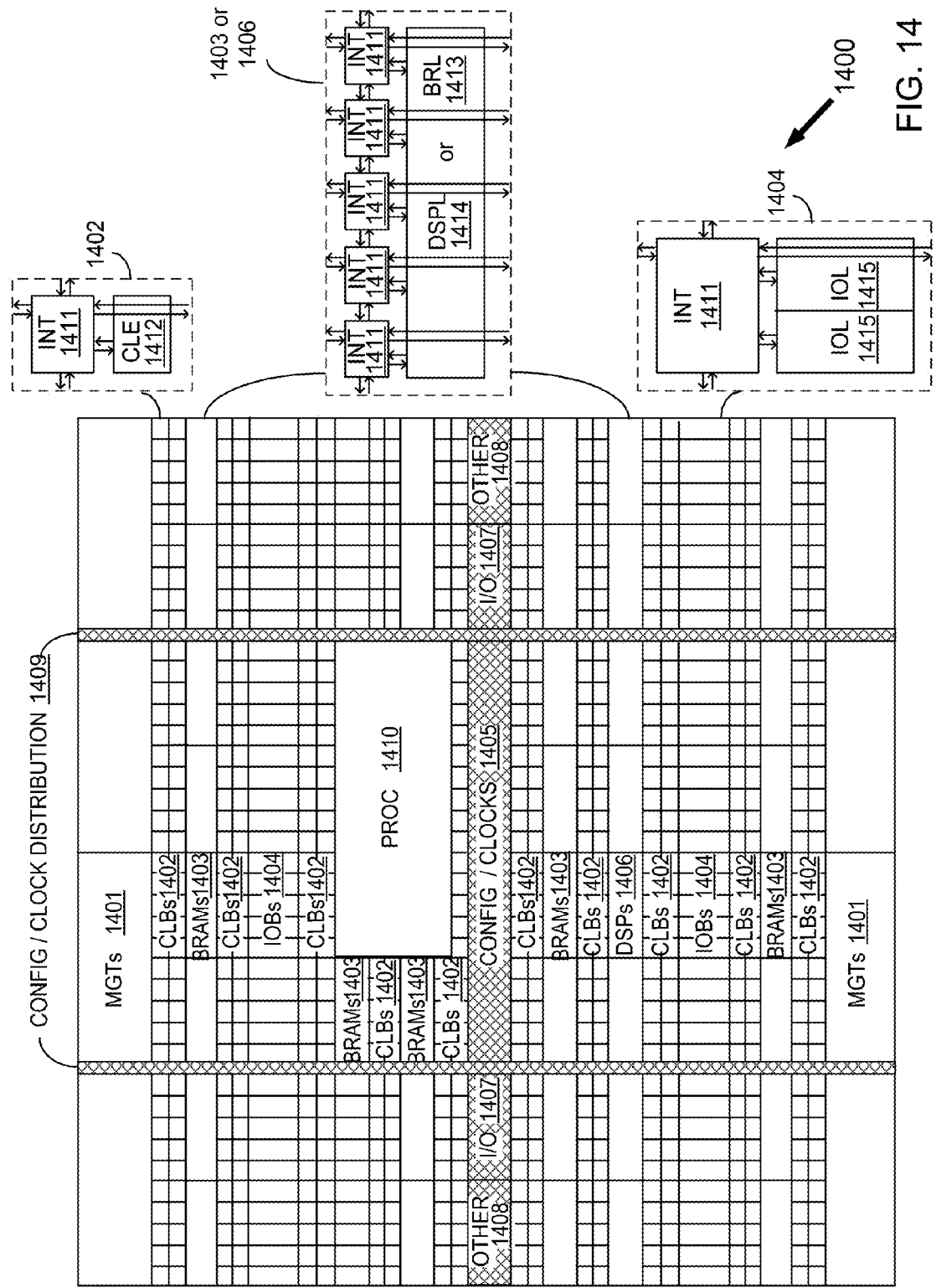
FIG. 14 is a block diagram of a device having programmable resources including the circuits of FIGS. 2-12.

Turning now to FIG. 14, a block diagram of a device having programmable resources, including memory elements as described above, is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 14 comprises an FPGA architecture 1400 having a large number of different programmable tiles including multi-gigabit transceivers (MGTs) 1401, CLBs 1402, random access memory blocks (BRAMs) 1403, input/output blocks (IOBs) 1404, configuration and clocking logic (CONFIG/CLOCKS) 1405, digital signal processing blocks (DSPs) 1406, specialized input/output blocks (I/O) 1407 (e.g., configuration ports and clock ports), and other programmable logic 1408 such as digital clock managers, analog-to-digital converters, system monitoring logic, and so forth. Some FPGAs also include dedicated processor blocks (PROC) 1410, which may be used to implement a software application, for example.

In some FPGAs, each programmable tile includes a programmable interconnect element (INT) 1411 having standardized connections to and from a corresponding interconnect element in each adjacent tile. Therefore, the programmable interconnect elements taken together implement the programmable interconnect structure for the illustrated FPGA. The programmable interconnect element 1411 also includes the connections to and from the programmable logic element within the same tile, as shown by the examples included at the top of FIG. 14.

For example, a CLB 1402 may include a configurable logic element (CLE) 1412 that may be programmed to implement user logic plus a single programmable interconnect element 1411. A BRAM 1403 may include a BRAM logic element (BRL) 1413 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1406 may include a DSP logic element (DSPL) 1414 in addition to an appropriate number of programmable interconnect elements. An 10B 1404 may include, for example, two instances of an input/output logic element (IOL) 1415 in addition to one instance of the programmable interconnect element 1411. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 1409 extending from this column are used to distribute the clocks and configuration signals across the breadth of the FPGA. Some FPGAs utilizing the architecture illustrated in FIG. 14 include additional logic blocks that disrupt the regular columnar structure making up a large part of the FPGA. The additional logic blocks may be programmable blocks and/or dedicated logic. For example, the processor block PROC 1410 shown in FIG. 14 spans several columns of CLBs and BRAMs.

Note that FIG. 14 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 14 are purely exemplary. For example, in an actual FPGA more than one adjacent column of CLBs is typically included wherever the CLBs appear in order to facilitate the efficient implementation of user logic. While the embodiment of FIG. 14 relates to an integrated circuit having programmable resources, it should be understood that the circuits and methods set forth in more detail below could be implemented in any type of ASIC.

Figure 15:
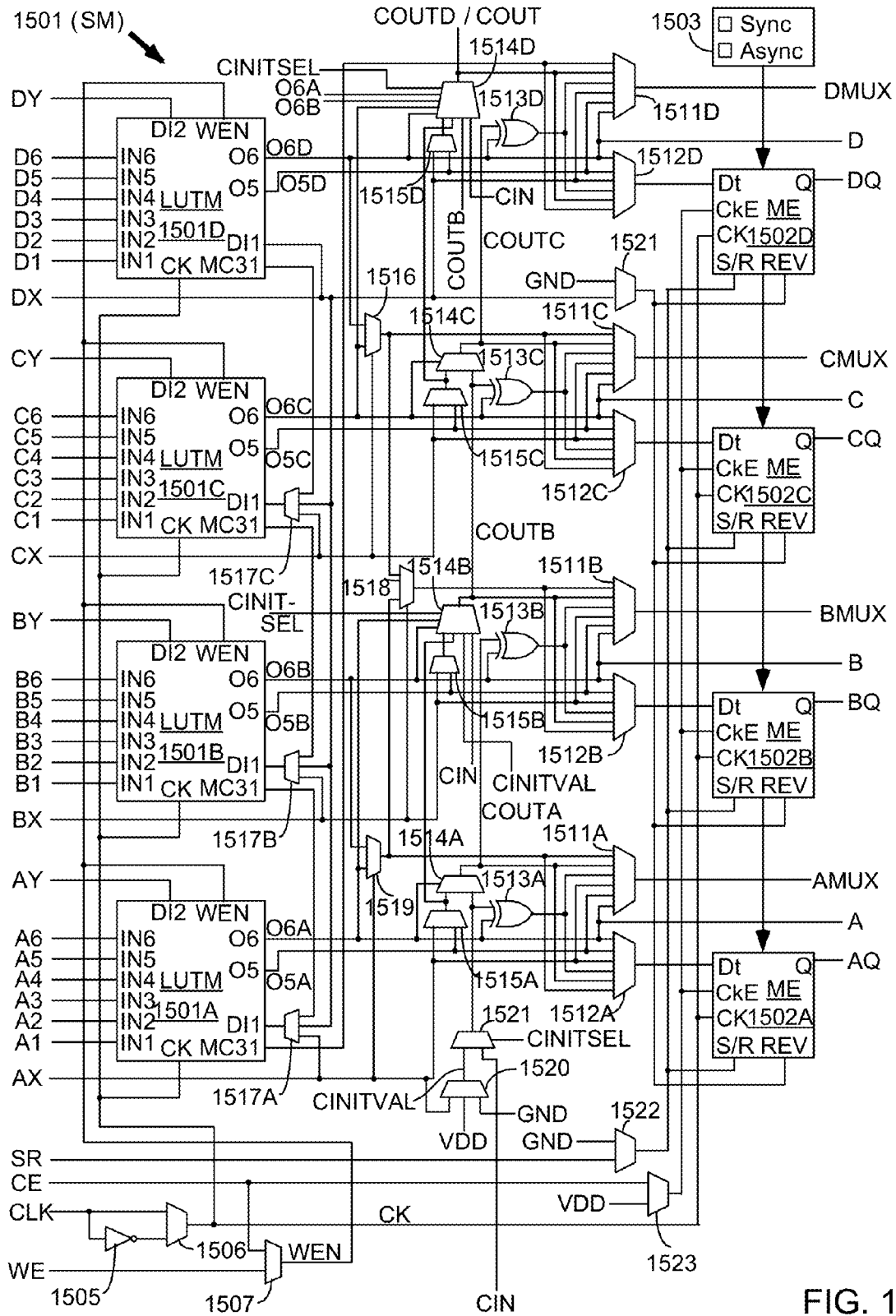
FIG. 15 is block diagram of a configurable logic element of the device of FIG. 14 according to an embodiment.

Turning now to FIG. 15, a block diagram of a configurable logic element of the device of FIG. 14 according to an embodiment is shown. In particular, FIG. 15 illustrates in simplified form a configurable logic element of a configuration logic block 1402 of FIG. 14. In the embodiment of FIG. 15, slice M 1501 includes four lookup tables (LUTMs) 1501A-1501D, each driven by six LUT data input terminals A1-A6, B1-B6, C1-C6, and D1-D6 and each providing two LUT output signals O5 and O6. The O6 output terminals from LUTs 1501A-1501D drive slice output terminals A-D, respectively. The LUT data input signals are supplied by the FPGA interconnect structure via input multiplexers, which may be implemented by programmable interconnect element 1511, and the LUT output signals are also supplied to the interconnect structure. Slice M also includes: output select multiplexers 1511A-1511D driving output terminals AMUX-DMUX; multiplexers 1512A-1512D driving the data input terminals of memory elements 1502A-1502D; combinational multiplexers 1516, 1518, and 1519; bounce multiplexer circuits 1522-1523; a circuit represented by inverter 1505 and multiplexer 1506 (which together provide an optional inversion on the input clock path); and carry logic having multiplexers 1514A-1514D, 1515A-1515D, 1520-1521 and exclusive OR gates 1513A-1513D. All of these elements are coupled together as shown in FIG. 15. Where select inputs are not shown for the multiplexers illustrated in FIG. 15, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 15 for clarity, as well as from other selected figures herein.

In the pictured embodiment, each memory element 1502A-1502D may be programmed to function as a synchronous or asynchronous flip-flop or latch. The selection between synchronous and asynchronous functionality is made for all four memory elements in a slice by programming Sync/Asynch selection circuit 1503. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1502A-1502D are clocked by a clock signal CK, which may be provided by a global clock network or by the interconnect structure, for example. Such programmable memory elements are well known in the art of FPGA design. Each memory element 1502A-1502D provides a registered output signal AQ-DQ to the interconnect structure. Because each LUT 1501A-1501D provides two output signals, O5 and O6, the LUT may be configured to function as two 5-input LUTs with five shared input signals (IN1-IN5), or as one 6-input LUT having input signals IN1-IN6.

In the embodiment of FIG. 15, each LUTM 1501A-1501D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1517A-1517C for LUTs 1501A-1501C), or to the two 32-bit RAMs via input terminals DI1 and DI2. RAM write operations in the LUT RAMs are controlled by clock signal CK from multiplexer 1506 and by write enable signal WEN from multiplexer 1507, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1501A may also be provided to the general interconnect structure for shift register chaining, via output select multiplexer 1511D and CLE output terminal DMUX. Accordingly, the circuits and methods set forth above may be implemented in a device such as the devices of FIGS. 14 and 15, or any other suitable device.

Figure 16:
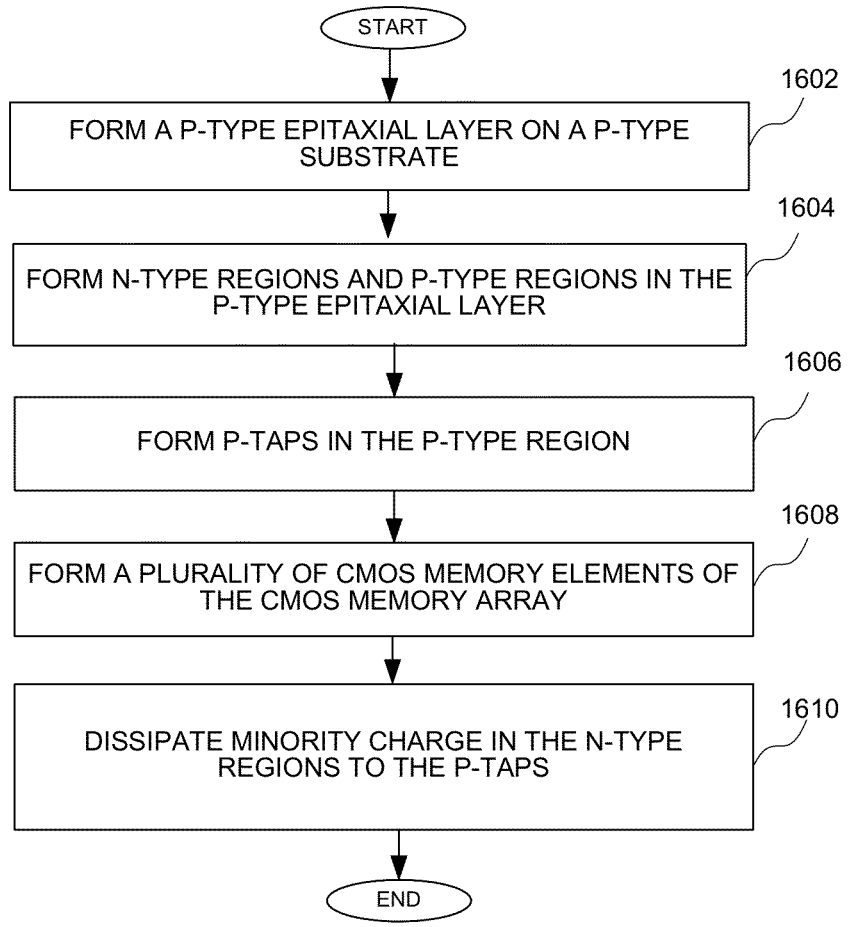
FIG. 16 is a flow chart showing a method of implementing an integrated circuit according to an embodiment.

Turning now to FIG. 16 is a flow chart showing a method of implementing an integrated circuit according to an embodiment. In particular, a p-type epitaxial layer is formed on a p-type substrate at a step 1602. An n-well and a plurality of p-wells are formed in the p-type epitaxial layer, each p-well having an n-type transistor coupled to the corresponding p-type transistor in the n-well at a step 1604. A plurality of CMOS memory elements of the CMOS memory array are formed at a step 1606. Minority charge in the n-well region and the plurality of p-wells is dissipated at a step 1608. The minority charge may be dissipated at the various p-taps as described above. The method of FIG. 16 may be implemented using any of the embodiments of FIGS. 1-15 as described, or any other suitable circuits.

It can therefore be appreciated that a new integrated circuit having improved radiation immunity and method of implementing an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. An integrated circuit having improved radiation immunity, the integrated circuit comprising:
   a substrate;
   an n-well formed on the substrate;
   a p-well formed on the substrate and extending along the n-well, wherein the integrated circuit comprises a plurality of memory cells having n-channel transistors in the p-well and p-channel transistors in the n-well and extending in a column along the p-well and n-well; and
   a p-tap formed in the p-well adjacent to the n-well, wherein the p-tap extends along the column of memory cells between the p-channel transistors formed in the n-well and the n-channel transistors formed in the p-well and is coupled to a ground potential.

2. The integrated circuit of claim 1, further comprising a second p-well adjacent to the n-well on another side of the n-well.

3. The integrated circuit of claim 2, wherein the second p-well comprises a second p-tap which is coupled to ground.

4. The integrated circuit of claim 3, wherein the second p-well comprises transistor elements, and the p-tap is between the n-well and the transistor elements formed in the second p-well.

5. The integrated circuit of claim 4, wherein the transistor elements of the second p-well are in a column.

6. The integrated circuit of claim 1, wherein the p-tap surrounds the n-well.

7. A method of forming integrated circuit having improved radiation immunity, the method comprising:
   forming an n-well on substrate;
   forming a p-well on the substrate and extending along the n-well, wherein the integrated circuit comprises a plurality of memory cells having n-channel transistors in the p-well and p-channel transistors in the n-well and extending in a column along the p-well and the n-well; and
   forming a p-tap in the p-well adjacent to the n-well, wherein the p-tap extends along the column of the memory cells between the p-channel transistors formed in the n-well and the n-channel transistors formed in the p-well and is coupled to a ground potential.

8. The method of claim 7, further comprising forming a second p-well adjacent to the n-well on another side of the n-well.

9. The method of claim 8, further comprising forming a second p-tap in the second p-well, wherein the second p-tap is coupled to ground.

10. The method of claim 7, wherein the n-channel transistors are formed in a first column and the p-channel transistors are formed in a second column.

11. The method of claim 10, wherein forming the p-tap comprises forming the p-tap between the n-channel transistors and the p-channel transistors of the plurality of memory cells.

12. The method of claim 7, wherein forming a p-tap comprises forming the p-tap around the n-well.

* * * * *